United States Patent
Tashiiro et al.

(10) Patent No.: US 8,254,197 B2
(45) Date of Patent: Aug. 28, 2012

(54) SEMICONDUCTOR MEMORY DEVICE AND SELF REFRESH TEST METHOD

(75) Inventors: Shinya Tashiiro, Yokohoma (JP); Keichiro Suga, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 305 days.

(21) Appl. No.: 12/632,225

(22) Filed: Dec. 7, 2009

(65) Prior Publication Data
US 2010/0142301 A1    Jun. 10, 2010

(30) Foreign Application Priority Data
Dec. 8, 2008   (JP) .................................. 2008-311776

(51) Int. Cl.
*G11C 7/00* (2006.01)

(52) U.S. Cl. ........................................ 365/222; 365/201

(58) Field of Classification Search .................... 365/222
See application file for complete search history.

(56) References Cited

U.S. PATENT DOCUMENTS

| | | | | |
|---|---|---|---|---|
| 5,321,661 A * | 6/1994 | Iwakiri et al. | ................. | 365/222 |
| 6,002,629 A * | 12/1999 | Kim et al. | ..................... | 365/222 |
| 6,545,925 B2 * | 4/2003 | Lee | ................. | 365/222 |
| 6,954,388 B2 * | 10/2005 | Thomann et al. | ............. | 365/195 |
| 7,215,589 B2 * | 5/2007 | Dono et al. | ................... | 365/222 |
| 7,580,307 B2 * | 8/2009 | Ishikawa | ....................... | 365/222 |
| 7,692,993 B2 * | 4/2010 | Iida et al. | ..................... | 365/222 |
| 7,719,916 B2 * | 5/2010 | Chun | ............................ | 365/222 |
| 2004/0233756 A1 * | 11/2004 | Choi | ............................. | 365/222 |
| 2006/0209610 A1 | 9/2006 | Dono | | |
| 2011/0007592 A1 * | 1/2011 | Tashiro | ....................... | 365/222 |

FOREIGN PATENT DOCUMENTS

| | | |
|---|---|---|
| JP | 2002-230996 A | 8/2002 |
| JP | 2006-260630 A | 9/2006 |
| WO | 2004/027780 A1 | 4/2004 |

* cited by examiner

*Primary Examiner* — Son Mai
(74) *Attorney, Agent, or Firm* — Sughrue Mion, PLLC

(57) ABSTRACT

A semiconductor memory device includes a memory cell array that includes a plurality of memory cells, an SR timer that determines a cycle of self refresh of the memory cell, a refresh counter that generates an internal address signal of the memory cell which is a target of the self refresh, and a circuit that outputs a pulse active signal to continuously execute refresh operation in one cycle of the self refresh.

7 Claims, 13 Drawing Sheets

| H61 INPUT | | H61 OUTPUT (H62 INPUT) | | | | ACTIVE NUMBER OF H61 OUTPUT RASAA |
|---|---|---|---|---|---|---|
| TEST1 | TEST2 | RASA1 | RASA2 | RASA3 | RASA4 | |
| LOW | LOW | HIGH | LOW | LOW | LOW | 1 |
| HIGH | LOW | LOW | HIGH | LOW | LOW | 2 |
| LOW | HIGH | LOW | LOW | HIGH | LOW | 3 |
| HIGH | HIGH | LOW | LOW | LOW | HIGH | 4 |

Fig. 4

SEMICONDUCTOR MEMORY DEVICE AND SELF REFRESH TEST METHOD

BACKGROUND

1. Field of the Invention

The present invention relates to a semiconductor memory device that includes a self refresh function, and more specifically, to a self refresh control circuit and a self refresh test method of a semiconductor memory device.

2. Description of Related Art

In recent years, in semiconductor memory devices (or simply referred to as devices) such as synchronous DRAM (Synchronous Dynamic Random Access Memory; hereinafter referred to as SDRAM) or pseudo SRAM (Static Random Access Memory), low power consumption in a data holding period has been strongly demanded since a system that uses a battery such as a portable telephone has been spread.

In SDRAM, pseudo SRAM or the like, self refresh (hereinafter referred to as SR) operation that automatically performs refresh operation in a device is performed for the purpose of suppressing power consumption. In terms of power consumption, longer cycle of the SR timer is desirable. However, if the cycle of the SR timer becomes longer, data holding time of the memory cell becomes longer as well, which increases the risk of data holding fault of the memory cell.

In order to realize both of the low power consumption of the device and to improve reliability, a method has now become popular that makes the cycle of the SR timer longer at a low temperature or normal temperature where data holding time of the memory cell is long, and makes the cycle of the SR timer shorter at a high temperature where data holding time of the memory cell is short.

Further, the semiconductor memory device such as SDRAM, pseudo SRAM, eDRAM (Embedded DRAM), or memory, has become larger in capacity, and in some cases, a plurality of word lines are simultaneously activated in the SR operation. Thus, in some cases, the noise that occurs in the SR operation seriously obstructs the operation rather than the noise that occurs in the normal access operation.

From the background as above, a method of testing correlation between the SR timer characteristics and the data holding time of the memory cell while accelerating the noise that occurs in the SR operation in the production process has been required.

A semiconductor memory device disclosed in Dono will be described in detail with reference to FIGS. 12, 13, and 14. FIGS. 12, 13, and 14 are diagrams for describing the semiconductor memory device disclosed in Japanese Unexamined Patent Application Publication No. 2006-260630 (Dono). The semiconductor memory device disclosed in Dono is an SDRAM device that includes a mode register (not shown).

The SDRAM device conforms to JEDEC standard. When the SDRAM receives a mode register set command (MRS command), and an A7 pin (external pin) is in an "H" state and A0-A6 pins and A8-A13 pins have predetermined values, the SDRAM is designed to be put into a predetermined test mode.

In addition, the SDRAM is arranged to assert a test mode flag during the predetermined test mode. In this example, the asserted/negated test mode flag is used in refresh counter control. The mode register and the test mode are shown, for example, in Japanese Unexamined Patent Application Publication No. 2002-230996 (Sawada).

FIG. 12 is a block diagram showing a semiconductor memory device disclosed by Dono. As shown in FIG. 12, the semiconductor memory device includes a counter controller 10, a refresh counter 20, a row decoder 30, and a memory cell array 40. Some components are not shown in FIG. 12 for the sake of clarity.

The counter controller 10 includes a first input unit and a second input unit. The counter controller 10 generates a counter control signal 103 based on a refresh command signal 101 input to the first input unit and a test mode flag 102 input to the second input unit. The refresh command signal 101 instructs execution of refresh operation in a form of a pulse. In summary, pulses are generated in accordance with the number of times refresh operations are carried out on the refresh command signal 101.

More specifically, when the test mode flag 102 is negated, the counter controller 10 outputs the refresh command signal 101 as the counter control signal 103. When the test mode flag 102 is asserted, the counter controller 10 outputs a constant value as the counter control signal 103. In summary, the pulses are transmitted in accordance with the number of times refresh operations are carried out on the counter control signal 103 while the test mode flag 102 is negated. On the other hand, when the test mode flag 102 is asserted, the counter control signal 103 does not change even in the refresh operation.

The refresh counter 20 receives the counter control signal 103 and outputs a counter output 104. The refresh counter 20 includes a structure similar to that of a known semiconductor memory and counts the pulses included in the counter control signal 103 to generate the counter output 104. The counter output 104 is also called an internal address.

The row decoder 30 also includes a structure similar to that of a known semiconductor memory. The row decoder 30 decodes the counter output 104 to generate a plurality of row addresses 105, in accordance with which a plurality of word lines are activated. According to the above configuration, the refresh operation is performed on the memory cell that is connected to a plurality of word lines among the memory cells included in the memory cell array 40.

It is possible to know which internal address the counter output 104 generated by the refresh counter 20 indicates by employing various known techniques. One example includes using a reset function of a refresh counter when the refresh counter is provided with a reset function.

For example, by counting the number of refresh commands that are input after reset operation for the refresh counter 20, it is possible to know which value the refresh counter 20 outputs without directly monitoring the counter output 104. As it is already known how the row decoder 30 decodes the counter output 104, if an internal address can be specified, it is possible to know which is the word line that is actually activated, or which is the row address 105. Accordingly, it can be readily known whether the row address 105 includes a specific address to be directly tested.

In the semiconductor memory device disclosed by Dono as above, the counter controller 10 can cause the refresh counter 20 to stop the count operation at a time when the row address 105 includes a specific address that is a target of failure analysis. Accordingly, the refresh counter 20 keeps outputting a counter output (internal address) 104 that relates to a specific address. Thus, the refresh operation where a specific address is the refresh target can be repeated, and the failure analysis can be performed in a state of the refresh operation.

FIG. 13 shows a detailed structure of the counter controller 10 and the refresh counter 20 of the semiconductor memory device disclosed by Dono. FIG. 14 is a timing chart showing variation of signals of each part.

As shown in FIG. 13, the counter controller 10 includes an inverter 11 and a two input AND gate 12. The AND gate 12 is provided with one input unit to which a refresh command signal 101 is input and the other input unit to which a test mode flag 102 is input through the inverter 11.

From the structure shown in FIG. 13, it can be clearly understood that, while the test mode flag 102 is in an "L" state, the AND gate 12 outputs the counter control signal 103 corresponding to the refresh command signal 101. On the other hand, while the test mode flag 102 is in an "H" state, the AND gate 12 keeps outputting "L".

The refresh counter 20 is provided with cascade connection of n (n is a natural number) sets of units, each of which including an input AND gate 21, a flip-flop (F/F) 22, and an output AND gate 23. Each of the flip-flops 22 is provided with a reset terminal (RST). The reset terminal is connected to a power up signal line 200. When a power is supplied to the semiconductor memory device, each of the flip-flops 22 is reset, and the counter output 104 takes default value "0".

The address of the word line that should be selected by the row decoder 30 in the refresh operation can be obtained by decoding the internal address output from the refresh counter. As the digit number (bus width) of the internal address is fewer than that of the address input from the external terminal in the normal writing/reading operations, the number of word lines that is concurrently selected by the internal address in the refresh operation is larger than that in the normal operation.

Referring to FIG. 14, in the period from T0 to T2, the test mode flag 102 is negated, so that the pulses are appeared on the counter control signal 103 corresponding to the refresh command signal 101. As the refresh counter 20 counts the number of pulses appeared on the counter control signal 103, the counter output 104 is incremented every time the refresh command is issued.

However, at T3, the MRS command is issued, the A7 is placed in "H" and the A0-A6 and A8-A13 pins have the predetermined values so that the SDRAM is put into the predetermined test mode, and the test mode flag 102 is asserted.

In T4 and subsequent periods, there is no signal change on the counter control signal 103 even when the refresh command is issued, and the counter control signal 103 takes a constant value. In summary, the refresh command only reaches the counter controller 10, and is not transmitted to the refresh counter 20. Therefore, the refresh counter 20 stops the count operation and keeps outputting of the previous counter output 104. The test mode flag 102 in this example is the stop signal to cause the refresh counter 20 to stop the count operation.

In the example shown in FIG. 14, "0002", which is the counter output 104 that is immediately before a predetermined test mode, is repeatedly output even in a certain test mode. In short, the refresh operation where the refresh target is a plurality of row addresses that correspond to "0002" is repeatedly performed by issuing the refresh commands.

As described above, according to Dono, the refresh operation that includes a specific address as a refresh target can be repeatedly performed, and the failure analysis can be performed with the state of the refresh operation.

FIG. 15 shows a flow chart of a refresh failure analysis disclosed by Dono that can be understood from the description above, which is a flow chart of a test method disclosed by Dono. First, in step S30, the refresh command is input, and the refresh counter is incremented to the interested address. Next, in step S31, the test mode is input, and the refresh counter is stopped to fix the internal address.

Then, in step S32, the refresh command is input so as to perform the refresh operation on only the interested address.

Lastly, in step S33, the fault reproduction is judged. When varying the internal address, the test mode is cancelled and the state is made back to start to repeat the series of operation. Described above is a test method of the analysis in the refresh operation disclosed by Dono.

The example of Dono is the test method of the device that is operable by the refresh command signal 101 which is externally input. Thus, regarding the test including the operation of the internal self refresh timer (hereinafter referred to as SR timer), the test method of the data holding time of the memory cell using the refresh command control needs to be constructed after obtaining the temperature characteristics of the data holding time of the memory cell and the SR timer, validating each correlation, and setting a standard value of the SR timer in advance.

FIG. 10 shows temperature characteristics of data holding time of the memory cell and the SR timer in SR operation. As shown in FIG. 10, the device that tends to be the SR operation fault obstructs the expected operation as there is no operating margin when the temperature characteristics of the data holding time of the memory cell in SR operation in which a plurality of word lines are activated approaches the temperature characteristics of the SR timer.

The temperature characteristics varies in a production process due to production tolerance or the like. Thus, the correlation between the temperature characteristics of the data holding time of the memory cell and the temperature characteristics of the SR timer of the device varies, which brings difference with the standard value of the SR timer set in the alternative test verification.

According to this test, there is a problem that the originally intended test cannot be performed on the device that obstructs the SR operation due to the deterioration of correlation between temperature characteristics of the data holding time of the memory cell and the SR timer by the noise due to the active operation of the plurality of word lines.

Further, in International Patent Publication No. WO2004/027780 (Shinozaki), short refresh operation is performed in which the data holding fault of the memory cell is accelerated without sufficiently amplifying the voltage differences between the bit lines by reducing the active period. However, in this short refresh operation, the active time of the word lines or the bit lines is so short that the voltage differences between the bit lines is not sufficiently amplified. Accordingly, it is not possible to perform validation in which the active noise such as the interference of the adjacent word lines or bit lines is sufficiently given on the memory cell having process abnormality including VT abnormality. In short, sufficient validation cannot be performed on the possible data holding fault of the memory cell.

SUMMARY

The present inventors have found a problem that, according to the test method of Dono, the data holding fault of the memory cell cannot be definitely detected while accelerating the noise that occurs in the SR operation.

A first exemplary aspect of an embodiment of the present invention is a semiconductor memory device including a memory cell array that includes a plurality of memory cells, an SR timer that determines a cycle of self refresh of the memory cell, a refresh counter that generates an internal address signal of the memory cell which is a target of the self refresh, and a circuit that outputs a pulse active signal to continuously execute refresh operation in one cycle of the self refresh.

A second exemplary aspect of an embodiment of the present invention is a test method of a semiconductor memory device is a test method of a memory cell array that includes a plurality of memory cells, the method including determining a cycle of self refresh, generating an internal address signal of the memory cell which is a target of the self refresh, and continuously performing refresh operation in one cycle of the self refresh.

Accordingly, continuous pulse active operation may be realized on the address of the memory cell which is the target. Thus, the data holding fault of the memory cell can be definitely detected while accelerating the noise that occurs in the SR operation.

According to the present invention, it is possible to definitely detect data holding fault of the memory cell while accelerating the noise that occurs in the SR operation.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4 is a circuit diagram showing one example of a refresh counter test circuit of the semiconductor memory device according to the first exemplary embodiment;

DETAILED DESCRIPTION OF THE EXEMPLARY EMBODIMENTS

Hereinafter, a semiconductor memory device according to the exemplary embodiments of the present invention will be described with reference to the drawings. Throughout the drawings, the same components are denoted by the same reference symbols, and the description will be omitted as appropriate. Further, in each drawing, the main parts of the semiconductor memory device according to the exemplary embodiments are enlarged as appropriate for the sake of clarity of illustration.

First Exemplary Embodiment

Figure 1:
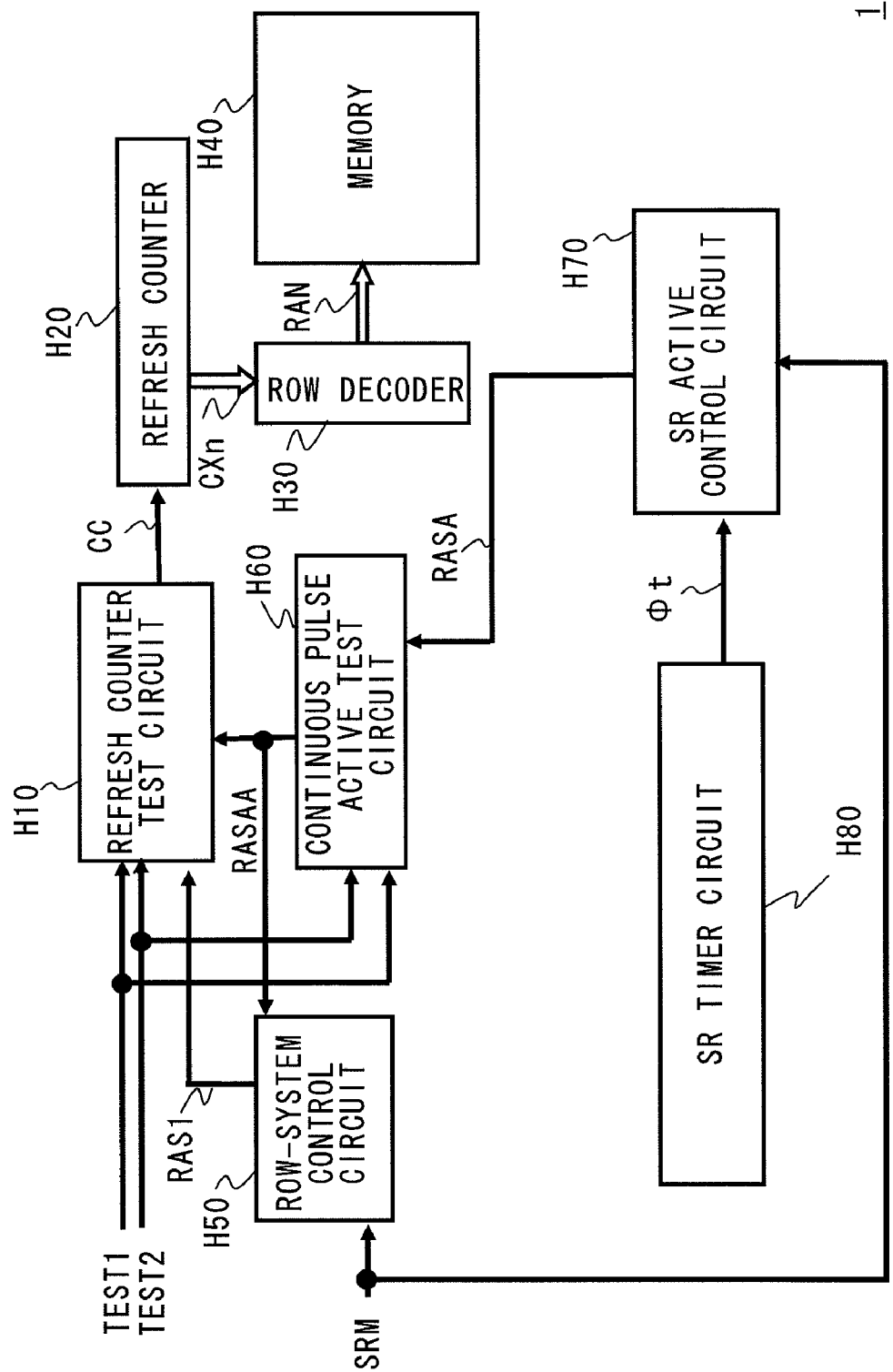
FIG. 1 is a block diagram showing the configuration of a semiconductor memory device according to a first exemplary embodiment.

A semiconductor memory device that includes a self refresh function according to the first exemplary embodiment of the present invention will be described with reference to FIG. 1. FIG. 1 is a block diagram showing the configuration of a semiconductor memory device 1 according to the first exemplary embodiment. The present invention relates to fields of an SDRAM, a pseudo SRAM, and an eDRAM. The semiconductor memory device 1 includes a function of setting an operation mode similarly to the SDRAM or the pseudo SRAM. The operation mode includes an SR mode that performs normal self refresh and a test mode that performs test on the memory cell.

The semiconductor memory device 1 includes a row decoder H30, a memory cell array H40, and the configuration for realizing SR operation. In the first exemplary embodiment, the semiconductor memory device 1 includes a continuous pulse active test circuit H60 that enables continuous pulse active operation of the same address and a refresh counter test circuit H10.

First, the components of the semiconductor memory device 1 will be described with reference to FIG. 1. As shown in FIG. 1, the semiconductor memory device 1 includes a refresh counter test circuit H10, a refresh counter H20, a row-system control circuit H50, a continuous pulse active test circuit H60, an SR active control circuit H70, and an SR timer circuit H80.

The SR timer circuit H80 determines the cycle of the self refresh of the memory cell, and outputs an SR timer signal φt. The SR timer circuit H80 mounts a cycle varying function depending on the ambient temperatures. The SR active control circuit H70 is supplied with the SR timer signal φt and an SR mode signal SRM, and outputs an SR control signal RASA. The continuous pulse active test circuit H60 is supplied with an SR active test 1 signal TEST1, an SR active test 2 signal TEST2, and the SR control signal RASA, and outputs a pulse active signal RASAA.

The row-system control circuit H50 is supplied with the pulse active signal RASAA and the SR mode signal SRM, and outputs a row-system control signal RAS1. The refresh counter test circuit H10 is supplied with the pulse active signal RASAA, the row-system control signal RAS1, the SR active test 1 signal TEST1, and the SR active test 2 signal TEST2, and outputs a refresh counter control signal CC.

The refresh counter H20 generates an internal address signal CXn of the memory cell which is the target of self refresh. The refresh counter H20 has the structure of the binary counter, receives the refresh counter control signal CC, and outputs the internal address signal CXn. The row decoder H30 receives the internal address signal CXn, and outputs a row address RAN. The memory cell array H40 receives the row address RAN.

The memory cell array H40 includes memory cells arranged in matrix. A word line and a bit line are connected to each memory cell. The row decoder H30 selects the word line used when the self refresh is performed by the internal address signal CXn. In summary, the row decoder H30 selects the row of the memory cell array H40, or controls active operation of the word line by the row address RAN.

The semiconductor memory device 1 according to the first exemplary embodiment includes a circuit of outputting the pulse active signal to continuously execute the refresh operation in one cycle of the self refresh. In the example shown in FIG. 1, the continuous pulse active test circuit H60 and the refresh counter test circuit H10 are arranged as such a circuit.

Figure 2:
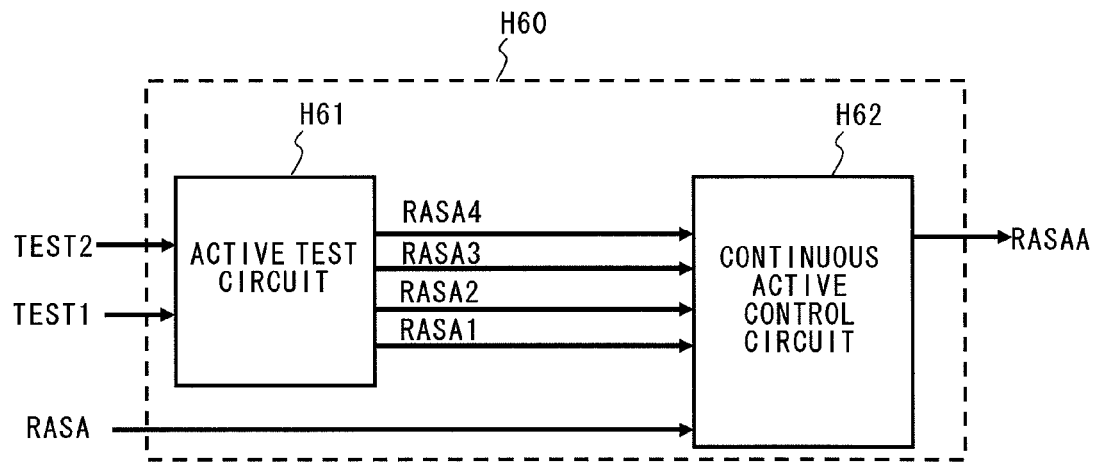
FIG. 2 is a circuit diagram showing one example of a continuous pulse active test circuit of the semiconductor memory device according to the first exemplary embodiment.

Now, the detailed structure of the continuous pulse active test circuit H60 and the refresh counter test circuit H10 will be described with reference to FIGS. 2, 3, and 4. FIG. 2 is a circuit diagram showing one example of the continuous pulse active test circuit H60 used in the semiconductor memory device 1 according to the first exemplary embodiment. The continuous pulse active test circuit H60 generates the pulse active signal for continuously executing the refresh operation. As shown in FIG. 2, the continuous pulse active test circuit H60 includes an active test circuit H61 and a continuous active control circuit H62.

The active test circuit H61 generates an active pulse number signal that determines the active pulse number from the active test signals that are externally input. More specifically, the active test circuit H61 receives an SR active test 1 signal TEST1 and an SR active test 2 signal TEST2, and outputs an active pulse number 1 signal RASA1, an active pulse number 2 signal RASA2, an active pulse number 3 signal RASA3, and an active pulse number 4 signal RASA4.

The continuous active control circuit H62 generates the pulse active signal in accordance with the active pulse number signals output from the active test circuit. More specifically, the continuous active control circuit H62 receives the active pulse number 1 signal RASA1, the active pulse number 2 signal RASA2, the active pulse number 3 signal RASA3, the active pulse number 4 signal RASA4, and the SR control signal RASA, and outputs the pulse active signal RASAA.

FIG. 4 is a diagram describing the state of the continuous active control circuit H62 used in the first exemplary embodiment. As shown in FIG. 4, the active state of the SR control signal RASA may be replaced with the pulse active signal RASAA using the SR active test 1 signal TEST1 and the SR active test 2 signal TEST2.

Figure 3:
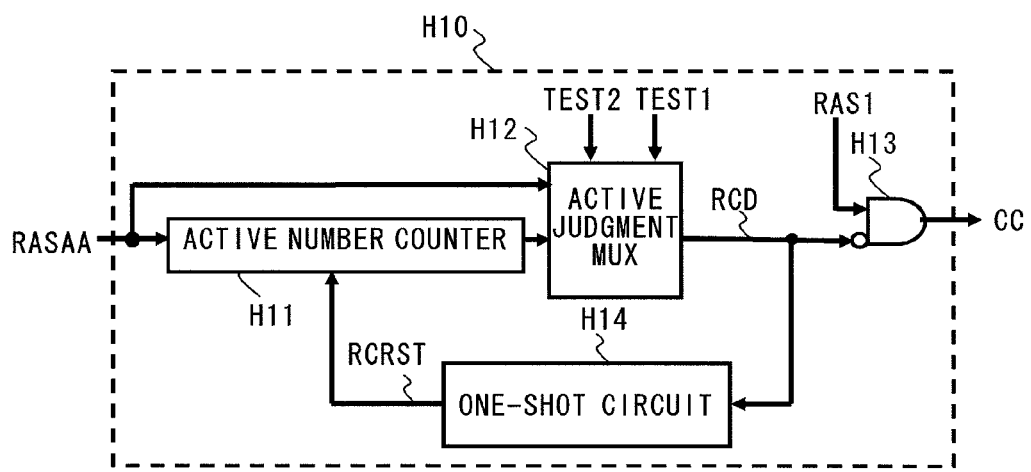
FIG. 3 is a diagram describing a state of the continuous pulse active test circuit according to the first exemplary embodiment.

FIG. 3 is a circuit diagram showing one example of the refresh counter test circuit H10 used in the semiconductor memory device 1 according to the first exemplary embodiment. The refresh counter test circuit H10 generates a refresh counter control signal that controls the refresh counter based on the pulse active signal. As shown in FIG. 3, the refresh counter test circuit H10 includes an active number counter H11, an active judgment MUX H12, a refresh counter test side logic circuit H13, and a one-shot circuit H14.

The active number counter H11 counts the number of refresh operations according to the pulse active signal. The active number counter H11 is supplied with the pulse active signal RASAA, and counts the plurality of continuous operation states.

The active judgment MUX H12 compares the number of refresh operations counted by the active number counter H11 with the active pulse number in accordance with the active pulse number signal, and judges whether to continuously perform refresh operation. The active judgment MUX H12 is supplied with the output of the active number counter H11, the SR active test 1 signal TEST1, the SR active test 2 signal TEST2, and the pulse active signal RASAA, and outputs a continuous pulse active period signal RCD.

The one-shot circuit H14 receives the continuous pulse active period signal RCD, outputs a continuous pulse active reset signal RCRST, and resets the active number counter H11. The refresh counter test side logic circuit H13 outputs the refresh counter control signal to continuously perform the refresh operation upon judging by the active judgment MUX H12 that the number of refresh operations counted by the active number counter H11 has not reached the active pulse number.

The refresh counter test side logic circuit H13 receives the inverted continuous pulse active period signal RCD and the row-system control signal RAS1, and outputs the refresh counter control signal CC. Note that the continuous pulse active control number is set according to the circuit size or required reliability of the device, and can be arbitrarily determined.

Figure 5:
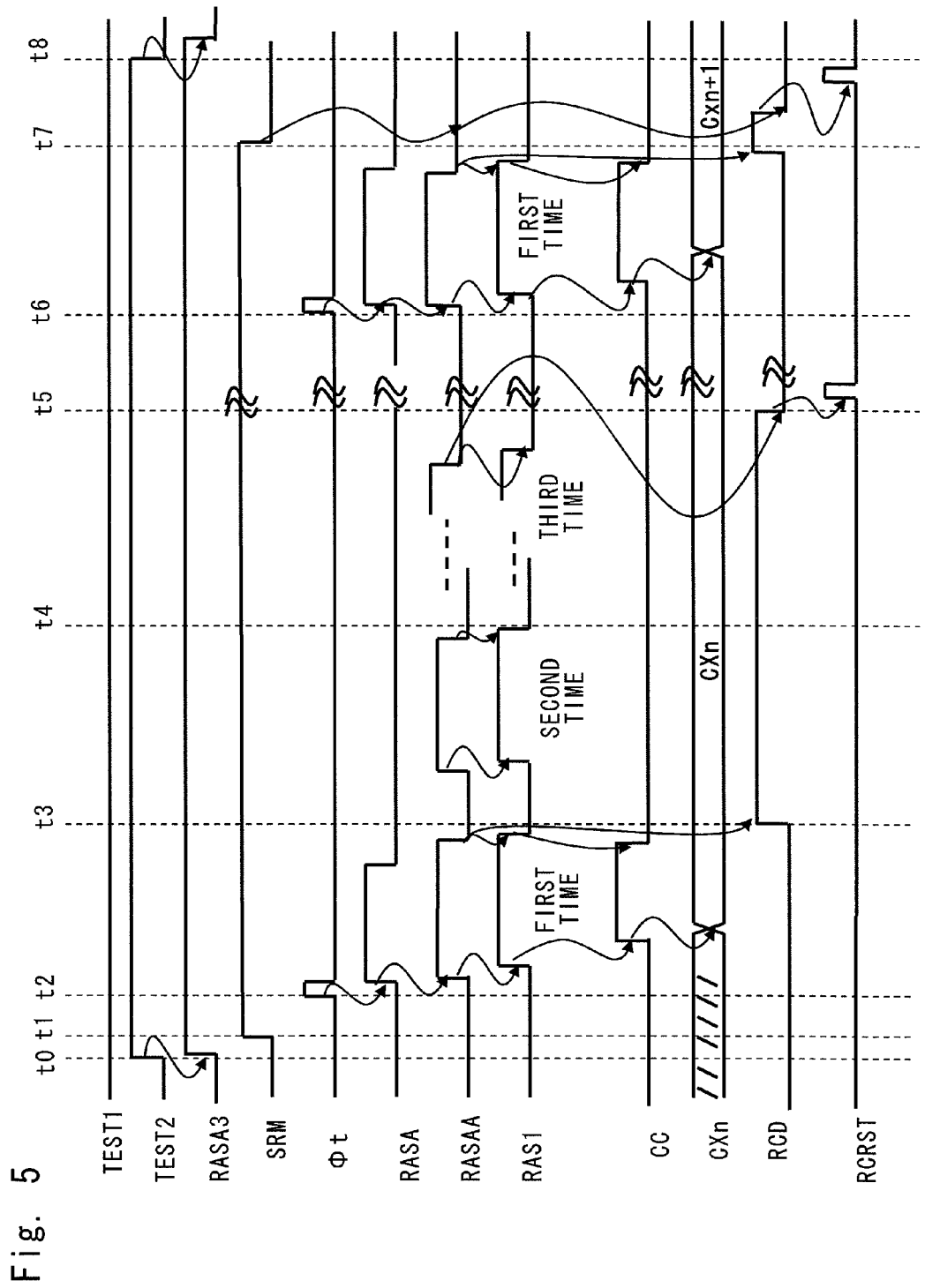
FIG. 5 is a timing chart to describe the operation of the semiconductor device according to the first exemplary embodiment.

The semiconductor memory device 1 includes a mode set function to set the test mode of setting of the active pulse number of SR in advance. Now, with reference to FIG. 5, the operation of the semiconductor memory device 1 according to the first exemplary embodiment will be described. FIG. 5 shows, as one example, a case in which three continuous pulse active operations are set with receiving the states of the SR active test 1 signal TEST1 and the SR active test 2 signal TEST2.

As shown in FIG. 5, at timing t0, the SR active test 1 signal TEST1 is set to inactive level LOW and the SR active test 2 signal TEST2 is set to active level HIGH so as to set the continuous pulse active number to three times by the mode set function of the device. The active test circuit H61 in the continuous pulse active test circuit H60 sets, as shown in FIG. 4, the active pulse number 3 signal RASA3 to the active level HIGH.

Then, in order to perform the SR operation at timing t1, the SR mode signal SRM is set to active level HIGH through the mode set function of the device.

At timing t2, the SR active test 1 signal TEST1, the SR active test 2 signal TEST2, and the SR mode signal SRM set at timing t1 keep the state. Then, in order to perform proper data holding operation of the memory cell with respect to the ambient temperature, the SR timer signal φt is output from the SR timer circuit H80 in a form of a one-shot pulse signal with a certain cycle. Upon outputting of the SR timer signal φt, the SR control signal RASA is set to active level HIGH by the SR active control circuit H70.

As the SR control signal RASA and the active pulse number 3 signal RASA3 are in the active state, the continuous active control circuit H62 in the continuous pulse active test circuit H60 is ready for the three continuous pulse active operations as shown in FIG. 4. First, the pulse active signal RASAA is set to active level HIGH as the first operation.

Next, when the pulse active signal RASAA is in the active level HIGH, the row-system control signal RAS1 is in the active level HIGH in the row-system control circuit H50 so as to control the row address system.

Then, it is verified that the three continuous pulse active operations set in the mode set function are still at the first operation, to determine whether to operate the refresh counter H20. More specifically, the active number counter H11 in the refresh counter test circuit H10 counts the number of active level HIGH of the pulse active signal RASAA. Then, the active judgment MUX H12 compares the active state of the SR active test 1 signal TEST1 and the SR active test 2 signal TEST2 with the number of active level HIGH of the pulse active signal RASAA to perform judgment. At timing t2, it is judged that the expected continuous pulse active operation is at the first operation, and the continuous pulse active period signal RCD is fixed to the inactive level LOW.

Upon receiving the active state of the row-system control signal RAS1 and the continuous pulse active period signal RCD by the refresh counter test side logic circuit H13 in the refresh counter test circuit H10, the refresh counter control signal CC is in the active level HIGH. Then, the refresh counter H20 is counted up, so as to determine the internal address signal CXn of the SR operation. The SR control signal RASA and the pulse active signal RASAA are one-shot pulse signals, and its pulse widths correspond to the time required for establishing the memory cell active operation.

Note that the control and the operation of the memory cell array H40 by control of the row-system control circuit H50 upon outputting the pulse active signal RASAA are already known, so that the description will be omitted.

When the first active operation of the first SR control signal RASA by the SR active control circuit H70 is completed, the pulse active signal RASAA is in the inactive level LOW through the continuous pulse active test circuit H60. The row-system control signal RAS1 is also in the inactive level LOW through the row-system control circuit H50, and the refresh counter control signal CC is also in the inactive level LOW. The first SR operation, or the active pulse operation of the memory cell array H40 is thus completed.

At timing t3, the active pulse number 3 signal RASA3 and the SR mode signal SRM that are activated with the state of the SR active test 1 signal TEST1 and the SR active test 2 signal TEST2 keep the state of timing t2. As the cycle of the SR timer circuit H80 has not been reached, the SR timer signal $\phi t$ which causes the SR operation is in inactive level LOW. The SR control signal RASA that controls the SR active operation with the state of the SR timer signal $\phi t$ keeps the inactive level LOW through the SR active control circuit H70.

Now, the continuous pulse active operation of the same address is started. First, in order to start the expected continuous pulse active operation of the same address, the active number counter H11 needs to be stopped and the the internal address signal CXn which is the internal address needs to be fixed during the continuous pulse active period.

After the pulse active operation by the pulse active signal RASAA in synchronization with the SR control signal RASA upon outputting the SR timer signal $\phi t$ is terminated, the continuous pulse active period signal RCD indicating the transition to the period of the second or subsequent pulse active operation is generated in the refresh counter test circuit H10.

The active number counter H11 counts the active number of the pulse active signal RASAA that controls the pulse active operation of the memory cell array H40. The active judgment MUX H12 then judges from the state of the SR active test 1 signal TEST1 and the SR active test 2 signal TEST2 indicating the setting of the continuous pulse active number if it is now the period to fix the internal address, and sets the continuous pulse active period signal RCD to the active level HIGH.

The refresh counter control signal CC that controls the refresh counter H20 is kept to be the inactive level LOW through the refresh counter test side logic circuit H13 by the active level HIGH of the continuous pulse active period signal RCD. Thus, the refresh counter H20 is in the stop state, and the internal address signal CXn is fixed.

Next, in order to perform the pulse active operation by the fixed internal address signal CXn, the pulse active signal RASAA is in the active level HIGH again while keeping the active width of timing t2 after a certain period of time through the continuous active control circuit H62 in the continuous pulse active test circuit H60. Then, the row-system control signal RAS1 that controls the row address system through the row-system control circuit H50 is in the active level HIGH.

From the above description, second pulse active operation where the internal address is fixed and the certain interval and width are kept is performed on the memory cell array H40. At timing t4, the third continuous pulse active operation is performed. The operation of the circuit at timing t4 is similar to timing t3.

At timing t5, the active pulse number 3 signal RASA3 that is generated with the state of the SR active test 1 signal TEST1 and the SR active test 2 signal TEST2, the SR mode signal SRM, the SR timer signal $\phi t$ which becomes the trigger of the SR operation, and the SR control signal RASA hold the state from timing t4, and are in the inactive level LOW.

In this example, the three continuous pulse active operations are set, and thus, the continuous pulse active period is completed. In order to indicate the end of the three continuous pulse active period, the count value of the active number of the pulse active signal RASAA and the number of pulse active operations set with the state of the SR active test 1 signal TEST1 and the SR active test 2 signal TEST2 are compared in the active judgment MUX H12 to make a judgment of termination, and the continuous pulse active period signal RCD is made inactive level LOW.

Receiving the continuous pulse active period signal RCD of inactive level LOW, the one-shot circuit H14 generates the continuous pulse active reset signal RCRST and resets the active number counter H11 for the initialization to prepare for the count of the operation of the next continuous pulse active operation.

At timing t6, the time of the cycle of the SR timer circuit H80 has passed, and the SR timer circuit H80 again outputs the SR timer signal $\phi t$ of the one-shot pulse of the active level HIGH. Then, a series of pulse active operations similar to timing t2 are started upon outputting the SR timer signal $\phi t$.

Note that timing t6 is different from timing t2 in that the address is advanced by one by adding one to the internal address signal CXn by the operation below. More specifically, receiving the inactive level LOW of the row-system control signal RAS1 and the continuous pulse active period signal RCD which is the judgment result of the active judgment MUX H12, the refresh counter control signal CC is activated by the refresh counter test side logic circuit H13 and the refresh counter H20 is counted up.

At timing t7, the SR mode is cancelled. At timing t7, the SR mode signal SRM and the active pulse number 3 signal RASA3 that is activated with the states of the SR active test 1 signal TEST1 and the SR active test 2 signal TEST2 keep the state from timing t6. Further, the SR timer signal $\phi t$ is in the inactive level LOW as the cycle of the SR timer circuit H80 has not reached.

Then, by the mode set function of the device, the SR mode signal SRM is in the inactive level LOW, and the SR control signal RASA is fixed to the inactive level LOW in the SR active control circuit H70. Further, the pulse active signal RASAA is fixed to the inactive level LOW through the continuous pulse active test circuit H60. Then, the row-system control signal RAS1 is fixed to the inactive level LOW through the row-system control circuit H50. The refresh counter control signal CC is fixed to the inactive level LOW by the refresh counter test circuit H10, and the internal address Cxn of the pulse active operation is fixed to the state of +1 where the address is advanced by one.

Therefore, the signal regarding the operation of the continuous pulse active operation is in the stop state. As the pulse active signal RASAA is in inactive level LOW, the device that was ready to transit to the second pulse active operation turns the continuous pulse active period signal RCD of the refresh counter test circuit H10 from the active level HIGH to the inactive level LOW. Then, the continuous pulse active reset signal RCRST, which is the input of the active number counter H11, is set to the active level HIGH in the one-shot circuit H14 to reset the active number counter H11.

At timing t8, the SR active test 1 signal TEST1 and the SR active test 2 signal TEST2 are made inactive level LOW in the mode set function of the device. The signal RASA3 is in the inactive level LOW in the active test circuit H61, and the setting of the number of continuous pulse active operations is cancelled. Described above is the operation from setting to cancelling of the continuous pulse active operation of the same address in the SR operation.

When the test mode described above is cancelled, the normal SR operation is performed, which means only one pulse active operation is performed. Accordingly, as shown in FIG. 4, upon receiving the SR active test 1 signal TEST1 and the SR active test 2 signal TEST2 of inactive level LOW, the active test circuit H61 in the continuous pulse active test circuit H60 makes the active pulse number 1 signal RASA1 active level HIGH.

Figure 6:
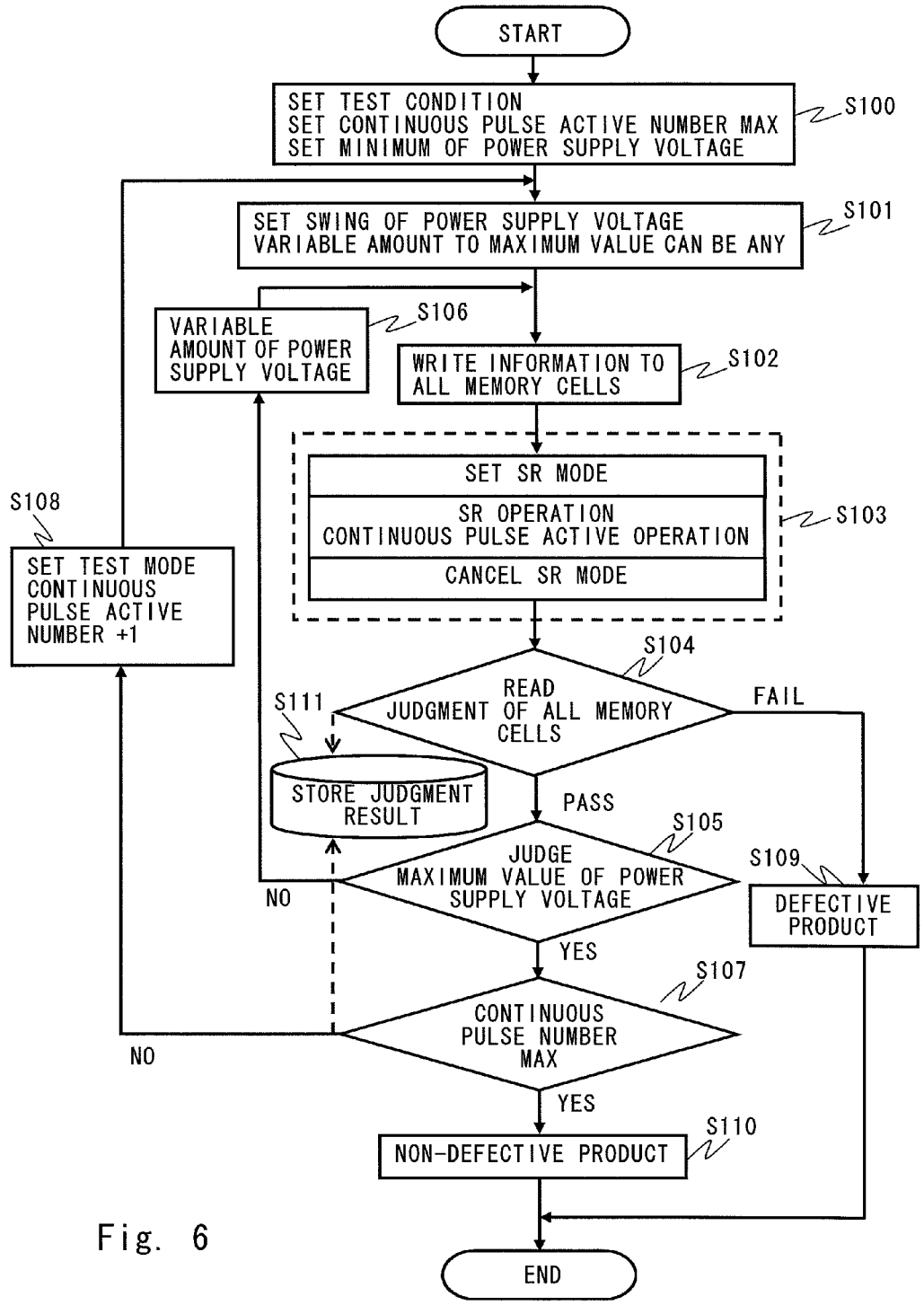
FIG. 6 is a flow chart showing a test method of the semiconductor memory device according to the first exemplary embodiment.

Next, the test method of the semiconductor memory device according to the first exemplary embodiment will be described with reference to FIG. 6. FIG. 6 is a flow chart of the test method of the semiconductor memory device according to the first exemplary embodiment. In FIG. 6, the SR operation failure is detected using both the continuous pulse active operation stated above and the swing of power supply voltage within the operation guarantee range in order to judge whether there is an influence of the active noise of a plurality of word lines with respect to the SR operation margin.

First, in step S100, the test condition of the SR test is set. More specifically, the continuous pulse active number MAX in the SR operation and the minimum value of the power supply voltage that is to be tested are arbitrarily set. Next, in step S101, the maximum value and the variable amount of the swing of power supply voltage are arbitrarily set.

In step S102, expected information is written to all the cells of the memory cell array H40. In step S103, the mode is set to the SR mode by the mode set function of the device, so as to start the pulse active operation in synchronization with the SR timer signal φt. The internal address signal CXn is set by the output of the refresh counter H20.

At this time, as the test mode has not been set, continuous pulse active operation is internally set to "once", which is the default value, and the SR operation with all the word lines being selected is started. The SR operation time is expected to be twice or more of the time required for all the word lines to be activated by the SR timer control in order to definitely perform the refresh operation of all the word lines that are activated. After that, the SR mode is cancelled.

In step S104, the read judgment is performed on all the cells of the memory cell array. What is failed in the above set condition is treated as defective product in step S109. On the other hand, what is passed the above set condition is judged whether the power supply voltage reaches the maximum side in step S105. When the power supply voltage does not reach the maximum side (NO in step S105), variable amount of the power supply voltage is set in step S106, and the operation repeats from steps S102 to S104 again.

When the power supply voltage reaches the maximum side (YES in step S105), it is judged in step S107 whether the operated number reaches the continuous pulse active number set in step S100. If it does not reach the continuous pulse active number that is set (NO in step S107), the test mode is set and the number of continuous pulse active operations is set to be added in step S108. Then, the step moves back to step S101, and steps S102 to S104 are executed that correspond to the test of the SR operation of the swing of power supply voltage again to repeat the operation to the MAX value of the continuous pulse active number.

When the operated number reaches the continuous pulse active number that is set (YES in step S107), which means when the device has passed all the conditions set in step S100, the device is processed as non-defective product in step S110.

Figure 11:
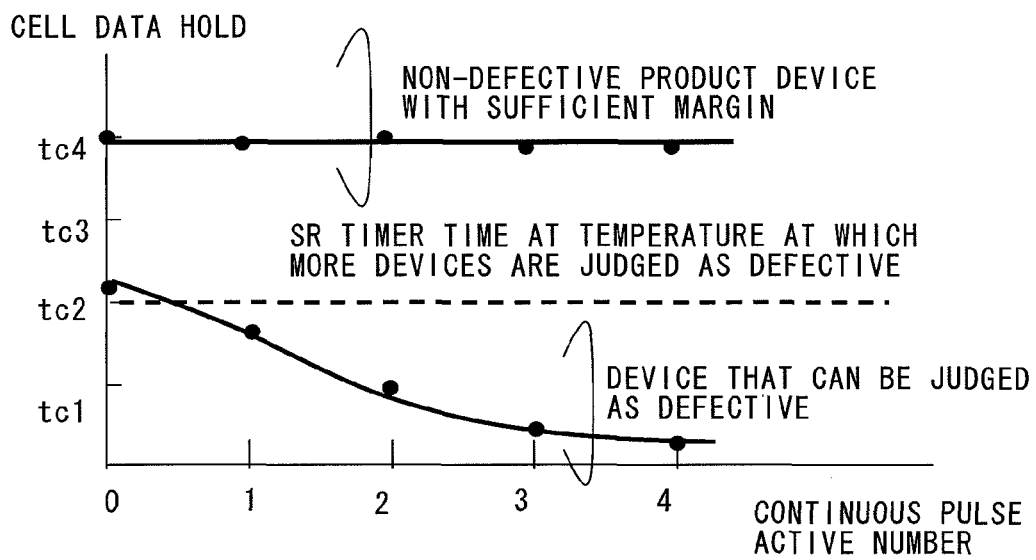
FIG. 11 is a diagram showing a relation between SR-defective continuous pulse active number and data holding time of the memory cell.
Figure 12:
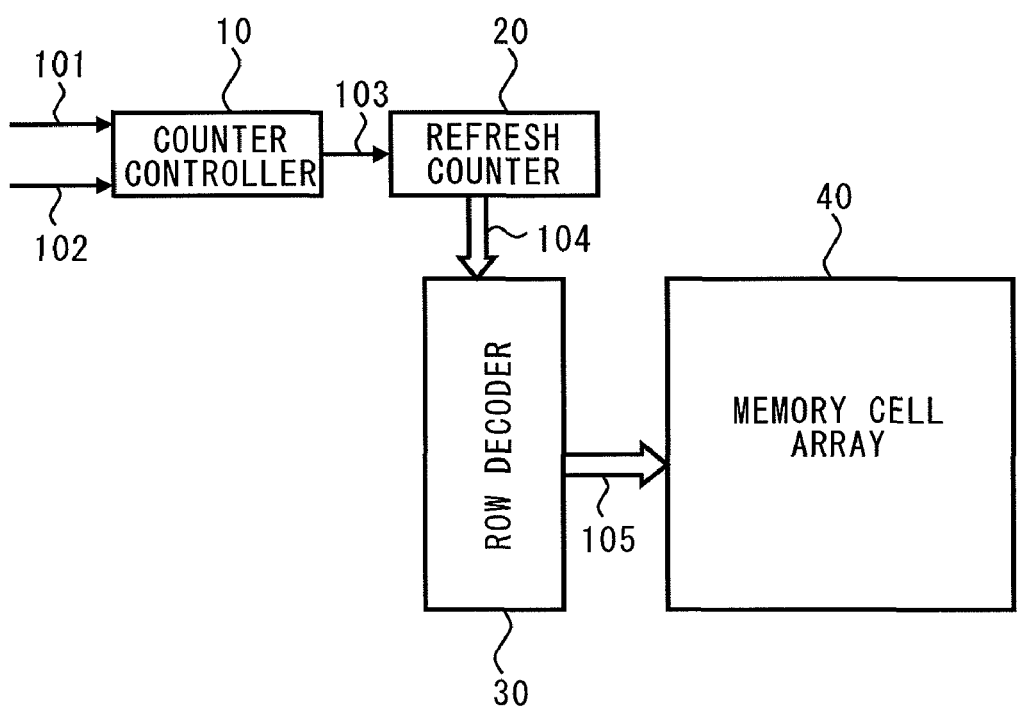
FIG. 12 is a block diagram showing the configuration of a semiconductor memory device of Dono.
Figure 13:
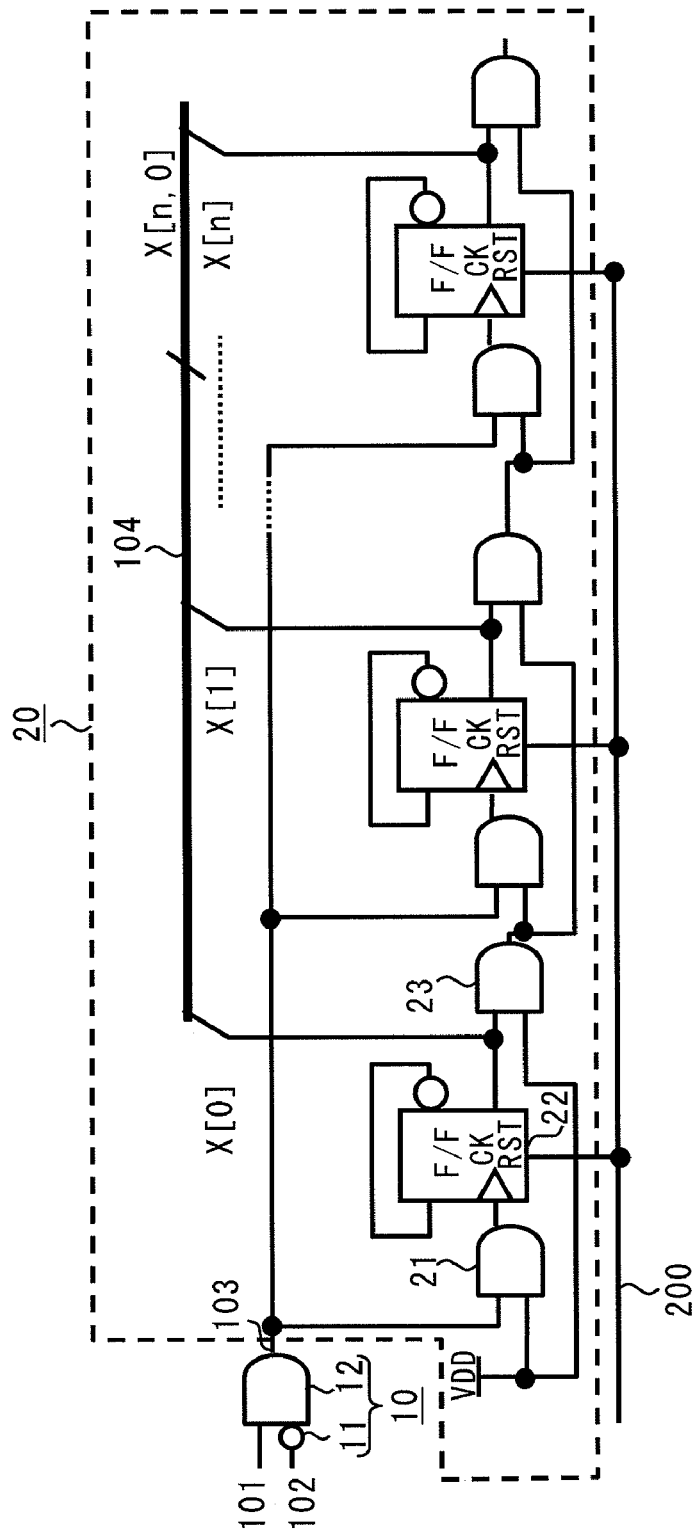
FIG. 13 is a circuit diagram showing the configuration of a counter controller of the semiconductor memory device of Dono.
Figure 14:
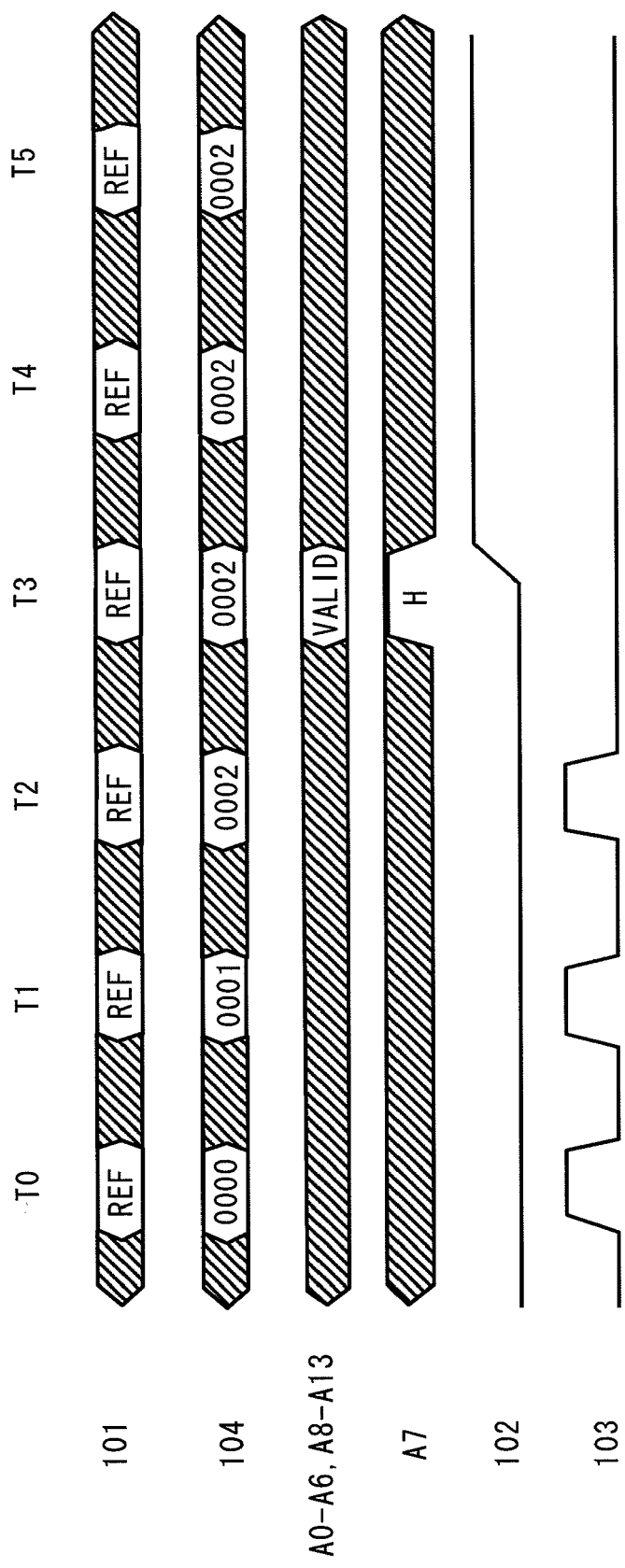
FIG. 14 is a timing chart to describe the operation of the semiconductor memory device of Dono.
Figure 15:
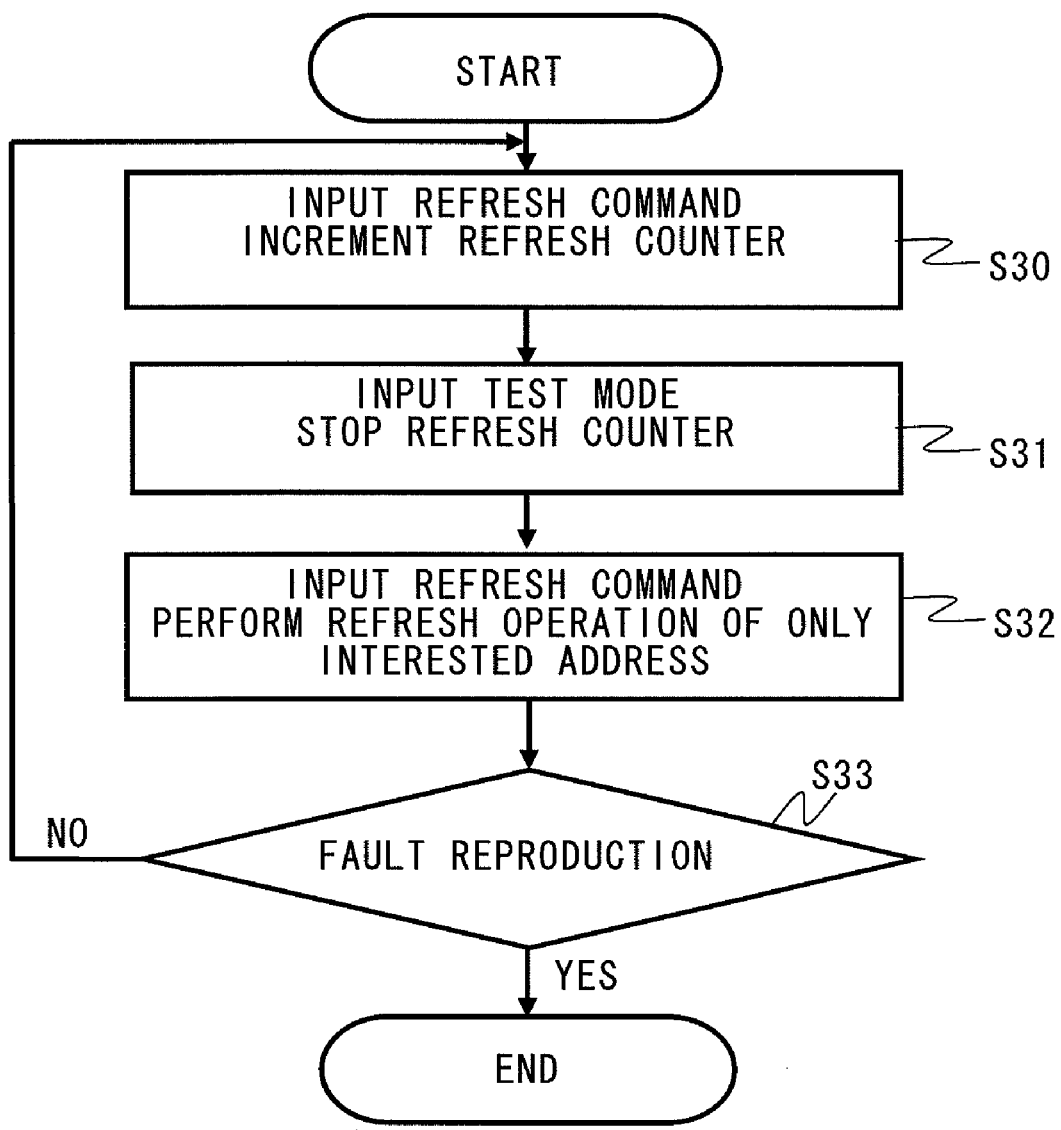
FIG. 15 is a flow chart showing a test method of the semiconductor memory device of Dono.

Now, with reference to FIG. 11, the relation between SR-defective continuous pulse active number and data holding time of the memory cell will be described. As shown in FIG. 11, when the noise that occurs in the SR operation itself is added to the device that is susceptible to the active noise of a plurality of word lines, the data holding time of the memory cell decreases, which does not satisfy the SR timer value expected at the ambient temperature. This causes SR operation fault.

The present invention includes the continuous pulse active test circuit H60 for performing the continuous pulse active operation on the same address in the SR mode. Accordingly, it is possible to test the data holding time of the memory cell with the SR timer whose cycle varies depending on ambient temperature while simultaneously and continuously activating a plurality of word lines and adding the noise.

In the related test method, such a test cannot be performed on the device that obstructs the operation due to the deterioration of correlation between the data holding time of the memory cell and the SR timer characteristics that vary depending on temperatures by the noise due to the active operations of the plurality of word lines. According to the present invention, the effective test can be executed on such a device as well.

Second Exemplary Embodiment

Figure 7:
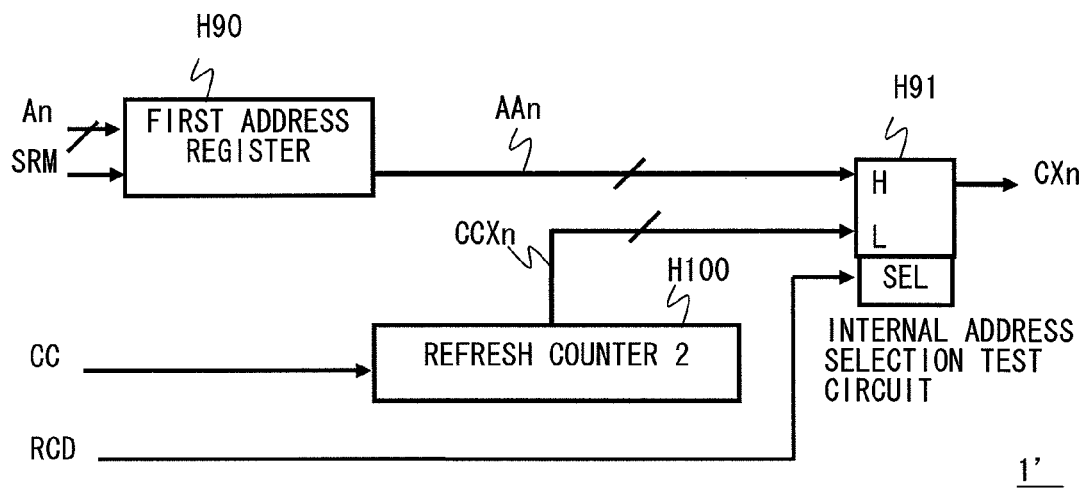
FIG. 7 is a block diagram showing the configuration of a semiconductor memory device according to a second exemplary embodiment.

A semiconductor memory device according to the second exemplary embodiment of the present invention will be described with reference to FIG. 7. FIG. 7 is a diagram showing the configuration of a semiconductor memory device 1' according to the second exemplary embodiment. The second exemplary embodiment is different from the first exemplary embodiment in that the refresh counter H20 shown in FIG. 1 is replaced with a refresh counter 2 H100, a first address register H90, and an internal address selection test circuit H91 shown in FIG. 7.

Note that the semiconductor device according to the second exemplary embodiment includes an SR timer that determines the cycle of the self refresh, and a refresh counter that generates an internal address of the refresh. Hereinafter, only the point which is different from the first exemplary embodiment will be described.

The first address register H90 receives a first external address signal An and an SR mode signal SRM, and outputs a first address register signal AAn. The refresh counter 2 H100 receives a refresh counter control signal CC, and outputs a refresh counter 2 output signal CCXn.

The internal address selection test circuit H91 selects one of the first address register signal AAn and the refresh counter 2 output signal CCXn by a continuous pulse active period signal RCD, and outputs the internal address signal CXn to determine the different internal address of the memory cell which is the target of the continuous refresh operation.

Figure 8:
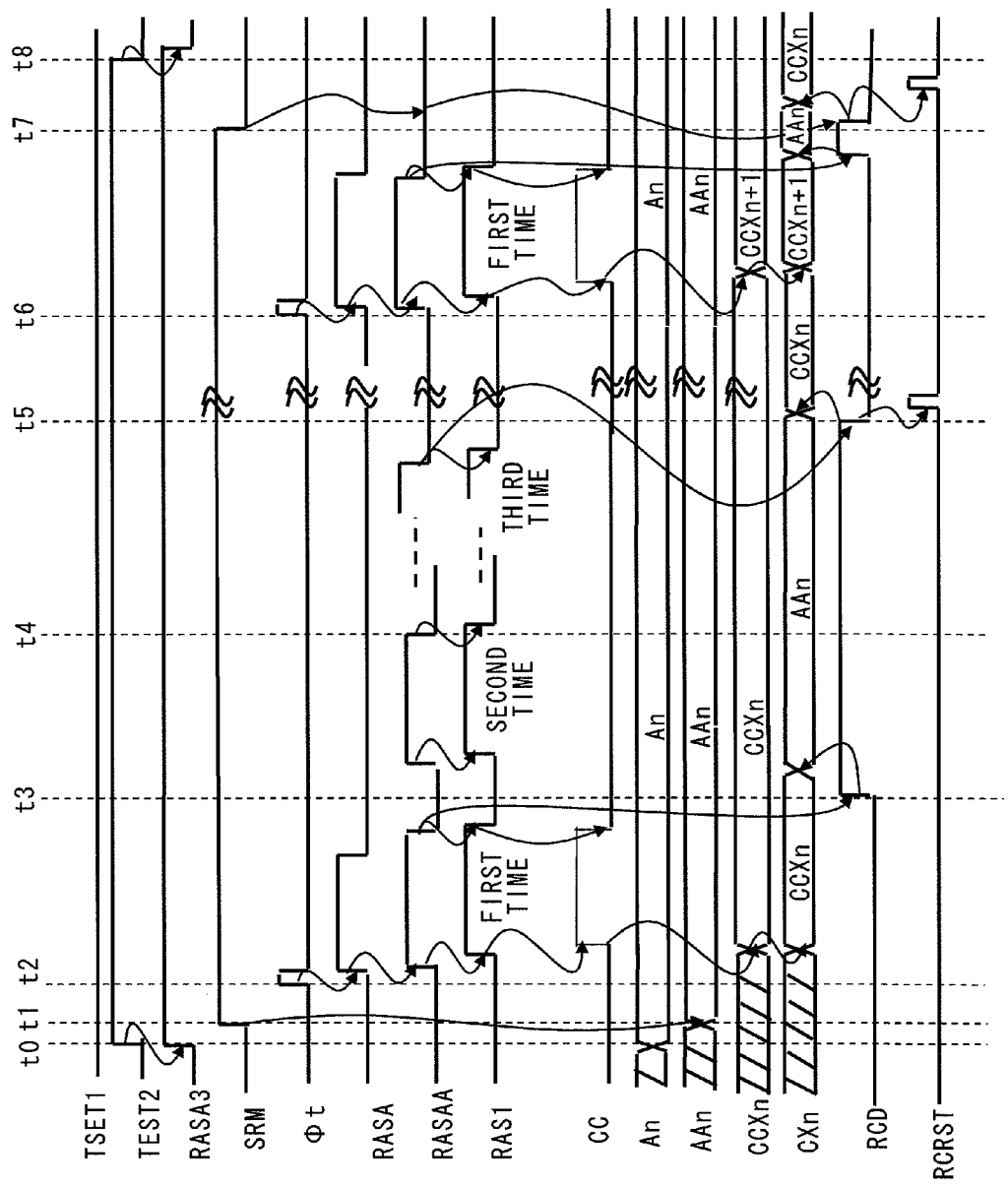
FIG. 8 is a timing chart to describe the operation of the semiconductor memory device according to the second exemplary embodiment.

Now, with reference to FIG. 8, the operation of the semiconductor memory device 1' according to the second exemplary embodiment will be described. FIG. 8 is a timing chart describing the operation of the semiconductor memory device 1' according to the second exemplary embodiment.

The timing chart shown in FIG. 8 is different from that of the first exemplary embodiment in that the first external address signal An is externally set in advance at timing t0. At timing t1, the first address register signal AAn is set in the first address register H90 by the active level HIGH of the SR mode signal SRM.

At timing t2, the SR operation is started by the pulse active operation in synchronization with the SR timer cycle upon outputting the signal Φt. Further, the continuous pulse active period signal RCD indicating the first pulse active operation is fixed to the inactive level LOW. Thus, as the internal address signal CXn of the internal address which is valid in the pulse active operation of the SR, the signal CCXn which is the output of the refresh counter 2 H100 is selected by the internal address selection test circuit H91.

At timing t3, the internal address is fixed, and the operation is in the period of the continuous pulse active operation. Thus, the continuous pulse active period signal RCD is in the active level HIGH. Further, the internal address selection test circuit H91 selects the first address register signal AAn as the internal address signal CXn.

Thus, as shown in timing t3 and t4, in the continuous active pulse operation of the SR operation, the first pulse active operation and the second or subsequent pulse active operation may be executed by different addresses.

At timing t5, as the period of the continuous pulse active operation is terminated, the continuous pulse active period signal RCD is in the inactive level LOW. The internal address selection test circuit H91 then selects the refresh counter 2 output signal CCXn as the internal address signal CXn.

At timing t6, as the SR timer signal φt is active, the first pulse operation is performed. Thus, the refresh counter 2 H100 counts up by the refresh counter control signal CC, and the refresh counter 2 output signal CCXn becomes +1.

As this operation is not the second or subsequent continuous pulse active period, the continuous pulse active period signal RCD is in the inactive level LOW. Thus, as the internal address signal CXn which is the internal address, the refresh counter 2 output signal CCXn which is the output of the refresh counter 2 H100 which is counted up by +1 is output.

Figure 9:
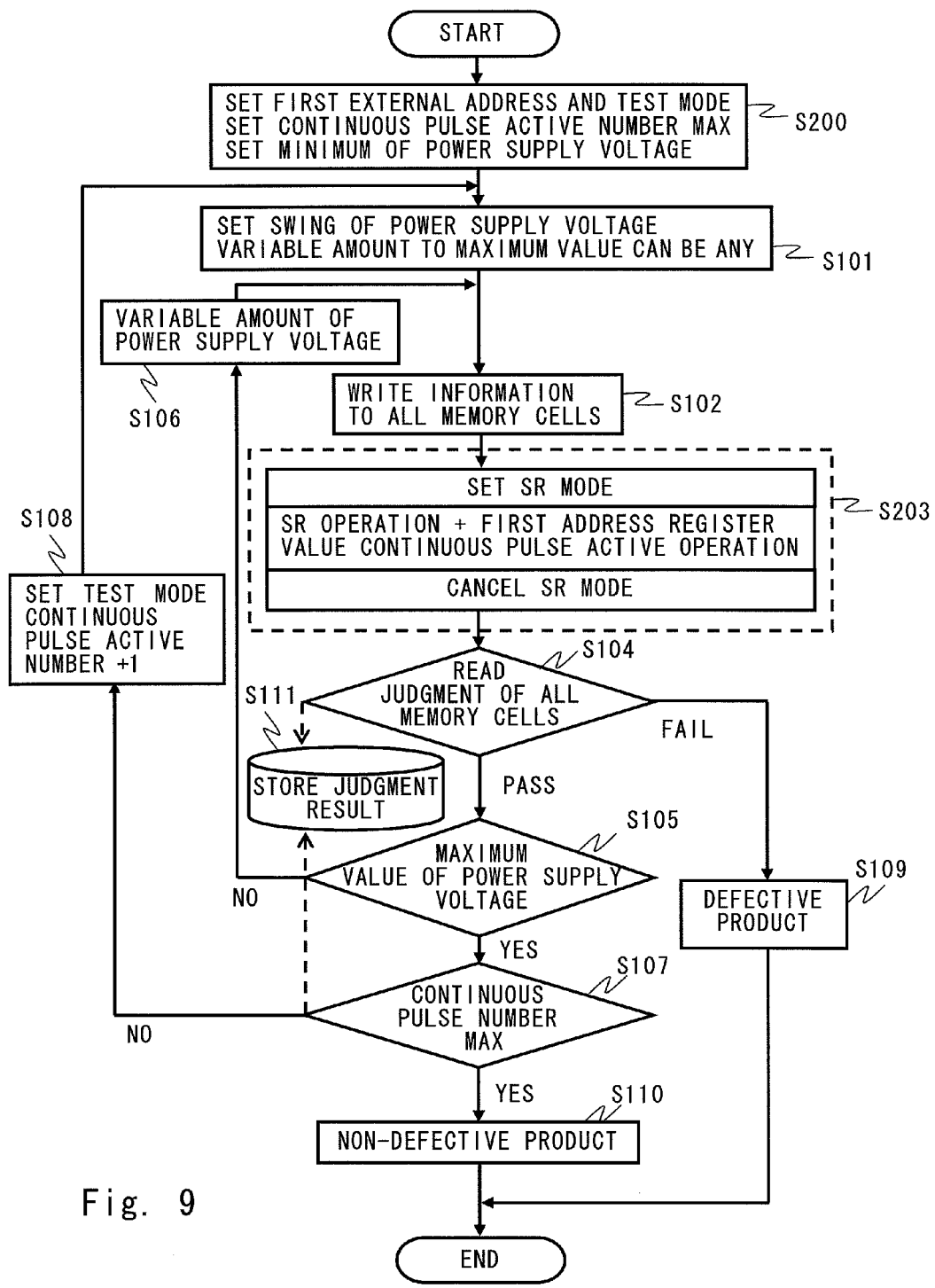
FIG. 9 is a diagram showing a test method of the semiconductor device according to the second exemplary embodiment.
Figure 10:
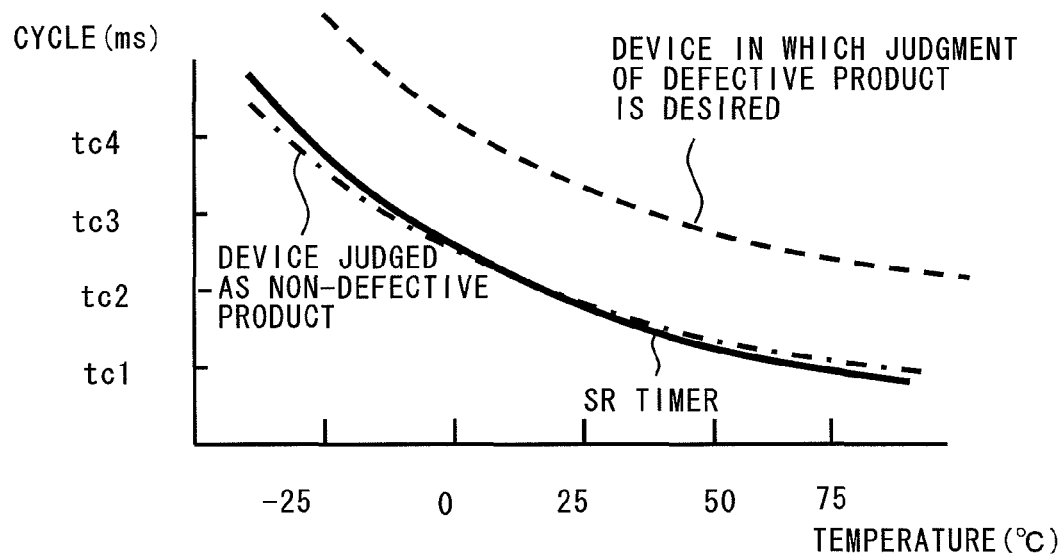
FIG. 10 is a diagram showing temperature characteristics of data holding time of a memory cell and an SR timer in SR operation.

Referring next to FIG. 9, the test method according to the second exemplary embodiment will be described. FIG. 9 is a flow chart of the test method of the semiconductor memory device according to the second exemplary embodiment. The second exemplary embodiment is different from the first exemplary embodiment in that the first external address needs to be set in step S200. Then, the continuous pulse active number MAX in the SR operation which is the condition of the SR test and the minimum value of the power supply voltage which is to be tested are arbitrarily set.

After that, as is similar to the first exemplary embodiment, the swing of power supply voltage is set (step S101), and the information is written to all the memory cells (step S102). Next, in step S203, the SR mode is set by the mode set function of the device. Accordingly, the first external address is taken into the first address register, and is used as the refresh address when the second or subsequent continuous pulse active operation is executed.

Hereinafter, the test method that is similar as in the first exemplary embodiment is performed, and the device which is failed is treated as defective product in step S109. Further, the device that has passed the set conditions is treated as non-defective product in step S110.

In the semiconductor memory device, the active state of a certain address may obstruct the SR operation due to the layout or production tolerance. According to the exemplary embodiments of the present invention, the continuous pulse operation can be performed on any set address. Thus, the active noise of the plurality of word lines of the certain address can be added. Accordingly, the test can be performed that detects the operational margin fault due to the deterioration of correlation between the data holding time of the memory cell and the SR timer characteristics that varies depending on temperatures.

As described above, according to the present invention, it is possible to test deterioration of correlation between the data holding time of the memory cell and the SR timer characteristics that varies depending on temperatures by the SR operation itself and to detect the margin fault of the SR operation while realizing the continuous pulse active operation of the same address and adding the active noise of a plurality of word lines.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
    a memory cell array that comprises a plurality of memory cells;
    an SR timer that determines a cycle of self refresh of the memory cell;
    a refresh counter that generates an internal address signal of the memory cell which is a target of the self refresh;
    a circuit that outputs a pulse active signal to continuously execute refresh operation in one cycle of the self refresh;
    a first address register that receives a first external address signal and generates a first address signal; and
    an internal address selection test circuit that selects one of the first address register signal and the internal address signal from the refresh counter, and determines the different internal address of the memory cell which is the target of continuous refresh operation,
    wherein the circuit continuously executes the refresh operation on a different internal address of the memory cell.

2. A semiconductor memory device comprising:
    a memory cell array that comprises a plurality of memory cells;
    an SR timer that determines a cycle of self refresh of the memory cell;
    a refresh counter that generates an internal address signal of the memory cell which is a target of the self refresh; and
    a circuit that outputs a pulse active signal to continuously execute refresh operation in one cycle of the self refresh; and wherein the circuit comprises:
a continuous pulse active test circuit that generates the pulse active signal to continuously executed refresh operation; and
a refresh counter test circuit that generates a refresh counter control signal to control the refresh counter based on the pulse active signal,
wherein the continuous pulse active test circuit comprises:
an active test circuit that generates an active pulse number signal to determine active pulse number from an active test signal externally input; and
a continuous active control circuit that generates the pulse active signal in accordance with the active pulse number signal output from the active test circuit.

3. A semiconductor memory device comprising:
a memory cell array that comprises a plurality of memory cells;
an SR timer that determines a cycle of self refresh of the memory cell;
a refresh counter that generates an internal address signal of the memory cell which is a target of the self refresh; and
a circuit that outputs a pulse active signal to continuously execute refresh operation in one cycle of the self refresh;
wherein the circuit comprises:
a continuous pulse active test circuit that generates the pulse active signal to continuously execute refresh operation; and
a refresh counter test circuit that generates a refresh counter control signal to control the refresh counter based on the pulse active signal, and
wherein the refresh counter test circuit comprises:
an active number counter that counts the number of refresh operations in accordance with the pulse active signal;
an active judgment circuit that compares the number of refresh operations counted by the active number counter with the active pulse number in accordance with the active pulse number signal to judge whether to continuously perform the refresh operation; and
a logic circuit that outputs the refresh counter control signal to continuously perform the refresh operation when it is judged by the active judgment circuit that the number of refresh operations counted by the active number counter has not reached the active pulse number.

4. The semiconductor memory device according to claim 2, wherein the circuit continuously executes the refresh operation on the same internal address of the memory cell.

5. The semiconductor memory device according to claim 2, wherein the circuit continuously executes the refresh operation on a different internal address of the memory cell.

6. The semiconductor memory device according to claim 3, wherein the circuit continuously executes the refresh operation on the same internal address of the memory cell.

7. The semiconductor memory device according to claim 3, wherein the circuit continuously executes the refresh operation on a different internal address of the memory cell.

* * * * *

UNITED STATES PATENT AND TRADEMARK OFFICE
CERTIFICATE OF CORRECTION

PATENT NO. : 8,254,197 B2
APPLICATION NO. : 12/632225
DATED : August 28, 2012
INVENTOR(S) : Shinya Tashiro and Koichiro Suga It is certified that error appears in the above-identified patent and that said Letters Patent is hereby corrected as shown below:

Title page, item (12) and (75), left column, please correct the Inventors names as follows:

Inventors: Shinya ~~Tashiiro~~ Tashiro, Yokohama (JP)
~~Keichiro~~ Koichiro Suga, Yokohama (JP)

Signed and Sealed this
Sixth Day of November, 2012

David J. Kappos
*Director of the United States Patent and Trademark Office*